US006203690B1

United States Patent
Findeis et al.

(10) Patent No.: US 6,203,690 B1
(45) Date of Patent: Mar. 20, 2001

(54) PROCESS OF REWORKING PIN GRID ARRAY CHIP CARRIERS

(75) Inventors: Paul F. Findeis, Glenham; John P. Gauci, Wappingers Falls; Krystyna W. Semkow, Poughquag; Renee L. Weisman, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/163,148

(22) Filed: Sep. 29, 1998

(51) Int. Cl.$^7$ ........................................................ C25F 3/00
(52) U.S. Cl. .................................. 205/683; 205/684
(58) Field of Search .................................. 205/683, 685, 205/674

(56) References Cited

U.S. PATENT DOCUMENTS

| 4,914,813 | 4/1990 | Layher et al. | 29/843 |
| 5,516,416 | 5/1996 | Canaperi et al. | 205/78 |
| 5,722,579 | 3/1998 | Yu et al. | 228/119 |
| 5,896,869 | * 4/1999 | Maniscalco et al. | 134/1.3 |

* cited by examiner

Primary Examiner—Kathryn Gorgos
Assistant Examiner—Thomas H Parsons
(74) Attorney, Agent, or Firm—Ira D. Blecker

(57) ABSTRACT

A process for reworking of PGA chip carriers where one or more I/O pins is unplated. The process includes electrolytically etching the I/O pins which removes any corrosion product from the unplated I/O pins and removes the top gold layer from the remaining I/O pins. The etchant includes a metal-providing compound selected from the group consisting of a silver salt, copper cyanide, silver cyanide, gold cyanide or mixtures thereof, at a concentration in the range from about 2.7 to about 4.1 g/l as metal; potassium or sodium carbonate at a concentration in the range from about 10 to about 100 g/l; and potassium or sodium cyanide at a concentration in the range from about 29 to about 35 g/l.

5 Claims, 1 Drawing Sheet

PROCESS OF REWORKING PIN GRID ARRAY CHIP CARRIERS

BACKGROUND OF THE INVENTION

1. Field of the Invention

The present invention is directed to the process of reworking pin grid array chip carriers, and more particularly, to the process of reworking pin grid array chip carriers using an electrolytic etch process.

2. Description of the Related Art

Ceramic, glass and glass-ceramic substrates have been widely used in the computer industry as chip carriers, wherein semiconductor integrated circuit chips are attached to the substrate. The chip carriers may be single layer or multilayer and may be also single chip or multichip. A particular kind of chip carrier is called a pin grid array (hereafter PGA) chip carrier wherein input/output (hereafter I/O) pins are used to connect the PGA chip carrier to the next level of packaging, usually a card.

In the manufacturing of a PGA, the I/O pins are brazed to I/O pads on a surface of the PGA chip carrier. Thereafter, the pins are nickel and gold electroplated. During the plating operation, all pins must contact a common electrode, for example the electrically conductive foil disclosed in Canaperi et al. U.S. Pat. No. 5,516,416, the disclosure of which is incorporated by reference herein, to pass current to them and carry on the plating process. A poor contact, or a complete lack of contact, with the electrode results in unplated I/O pins. Unplated I/O pins are unacceptable and must be reworked.

Further, if the gold plating was too thick or too thin on the I/O pins, the I/O pins would also have to be reworked.

It is not feasible to plate pins on a one-by-one basis so it is necessary to rework all the I/O pins.

The following references illustrate the state of the pertinent art.

Layher et al. U.S. Pat. No. 4,914,813, the disclosure of which is incorporated by reference herein, discloses the rebuilding of PGA chip carriers which includes removing the I/O pins and other metallurgy, replating the I/O pads, brazing new I/O pins to the I/O pads and replating the I/O pins with nickel and gold.

Yu et al. U.S. Pat. No. 5,722,579, the disclosure of which is incorporated by reference herein, discloses a method of reworking a PGA chip carrier which includes shearing off the I/O pins, polishing the surface of the PGA chip carrier, laying down new I/O pads and attaching new I/O pins.

A current rework process consists of shearing the I/O pins off, etching of any leftover braze, replating of top and bottom surface metallurgy, pin braze with new pins and plating of the new pins.

Such a process is time consuming and expensive. It would be desirable to have a rework process which is less time consuming and less expensive.

Accordingly, it is a purpose of the present invention to have a process for reworking PGA chip carriers wherein the entire PGA chip carrier does not need to be reworked in order to rework just the I/O pins.

It is another purpose of the present invention to have a process for reworking PGA chip carriers which is less time consuming and less expensive.

BRIEF SUMMARY OF THE INVENTION

The present invention relates to a method of reworking PGA chip carriers having at least one unplated I/O pin, the method comprising the steps of:

a. obtaining a PGA chip carrier having at least I/O pin that is plated with gold over nickel and at least one I/O pin that is unplated but contains a corrosion product where the I/O pin should be plated;

b. electrolytically etching the I/O pins with an aqueous etching solution comprising:

a metal-providing compound selected from the group consisting of a silver salt, copper salt, copper cyanide, silver cyanide, gold cyanide or mixtures thereof, at a concentration in the range from about 1 to about 6 g/l as metal;

potassium or sodium carbonate at a concentration in the range from about 10 to about 100 g/l; and potassium or sodium cyanide at a concentration in the range from about 29 to about 35 g/l, wherein the etching solution temperature is in the range from about 20 to about 30° C., the etching solution pH is in the range from about 11.5 to about 13, and the current density is in the range from about 7.5 to about 9.5 mA/cm$^2$, and wherein the plated I/O pin is stripped of gold and the unplated pin is stripped of corrosion product.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
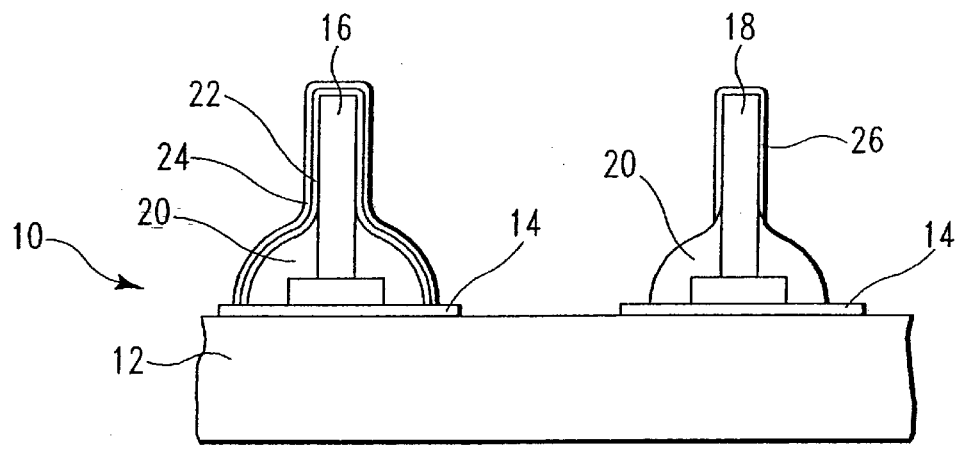
FIG. 1 is a cross-sectional view of a PGA chip carrier after nickel and gold plating showing a plated I/O pin and an unplated I/O pin with corrosion product.

Referring to the Figures in more detail, and particularly referring to FIG. 1, there is shown a PGA chip carrier 10 comprising ceramic substrate 12 having I/O pads 14 and I/O pins 16, 18 brazed thereto by braze 20.

The materials of the ceramic substrate 12, I/O pads 14, I/O pins 16, 18, and braze are conventional in nature. By way of illustration and not limitation, ceramic substrate 12 is an alumina ceramic having molybdenum or tungsten I/O pads 14. The molybdenum or tungsten I/O pads 14 are preferably plated with nickel. The I/O pins are made of Kovar, an alloy of cobalt, nickel and iron. The braze is a silver-copper braze or silver braze.

In conventional fashion, the I/O pins 16, 18 and surrounding braze 20 are then electroplated, first with nickel and then with gold. The I/O pin 16 in FIG. 1 is illustrated showing a layer of nickel 22 followed by a layer of gold 24. Plated I/O pin 16 is acceptably plated.

As noted earlier, if there is no or incomplete contact with an I/O pin, the I/O pin won't be plated. This is the case with I/O pin 18. Due to a defective electrical contact with I/O pin 18, the I/O pin was not plated. Rather, I/O pin has a coating of corrosion product 26 which may sometimes be coated with gold. Corrosion product 26 is brittle and weakly adherent to I/O pin 18. It is believed that the corrosion product 26 forms as a result of contact of the unplated I/O pin 18 with the gold plating bath. I/O pin 18 represents a defective I/O pin which must be reworked.

It has been surprisingly found that by electrolytically etching the PGA chip carrier 10 according to the present invention, gold layer 24 and corrosion product 26 are simultaneously stripped from I/O pins 16, 18, thereby readying the PGA chip carrier 10 for replating. It is no longer necessary to completely rework the PGA chip carrier by removing the I/O pins and rebuilding the PGA chip carrier as was discussed above.

According to the present invention, the defective PGA chip carrier 10 is immersed in an etchant solution and DC current is then applied. The PGA chip carrier 10 is connected as the anode. The etchant is an aqueous solution comprising (1) a metal-providing compound which may be a silver salt, copper salt, copper cyanide, silver cyanide, gold cyanide or mixtures thereof at a concentration in the range from about 1 to about 6 g/l as metal, (2) potassium or sodium carbonate at a concentration in the range from about 10 to about 100 g/l, and (3) potassium or sodium cyanide at a concentration in the range from about 29 to about 35 g/l.

The preferred etchant contains a silver salt, most preferably silver nitrate, as the metal-providing compound in the amount of 3.2 g/l (equivalent to 2 g/l of silver metal), the potassium or sodium cyanide is present in the amount of 32 g/l and the potassium or sodium carbonate is present in the amount of 15 g/l.

In use, the etch solution temperature is in the range from about 20 to 30° C., preferably 25° C., the etching solution pH is in the range from about 11.5 to 13, preferably 12, and the current density is about 7.5 to 9.5 mA/cm$^2$, preferably 8.5 mA/cm$^2$. The etching time is about 195 to 245 seconds, preferably 215 seconds per PGA chip carrier. The post etch dwell time is about 20 to 40 seconds, preferably 30 seconds. It is preferred that the etchant be agitated during the etching process.

If necessary, the side opposite the pin side of the PGA chip carrier may be masked off or taped to protect the underlying metallurgy.

Figure 2:
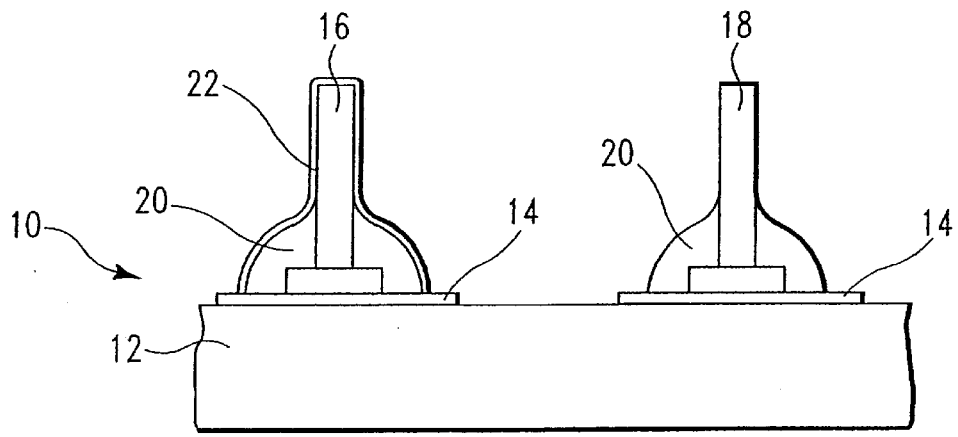
FIG. 2 is a cross-sectional view of the PGA chip carrier of FIG. 1 after rework processing according to the present invention.

Referring now to FIG. 2, there is shown the PGA chip carrier 10 of FIG. 1 after processing according to the present invention. After electrolytic etching of PGA chip carrier 10, gold layer 24 (but not nickel layer 22) has been removed from I/O pin 16 and corrosion product 26 has been removed from I/O pin 18. The braze 20 may also be etched back. Both of I/O pins 16, 18 are now ready for reexposure to the nickel and gold plating baths.

Figure 3:
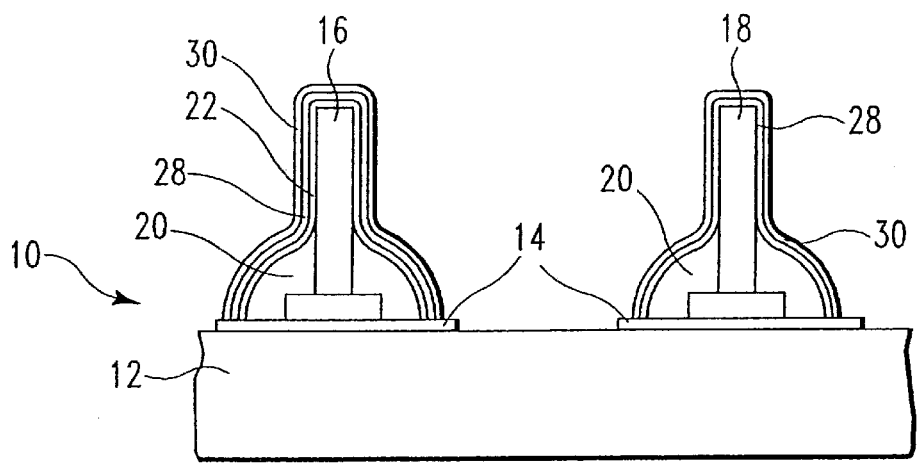
FIG. 3 is a cross-sectional view of the PGA chip carrier of FIG. 1 after rework processing according to the present invention followed by plating.

PGA chip carrier 10 after reexposure to the nickel and gold plating baths is shown in FIG. 3. As can be seen, I/O pin 16 has original nickel layer 22, followed by nickel layer 28 and gold layer 30. I/O pin 18, previously unplated, now contains nickel layer 28 and gold layer 30.

Thus, PGA chip carrier 10 has been reworked with minimal effort and expense.

It should be understood that while most of the discussion has been directed to reworking PGA chip carriers having unplated I/O pins, the process according to the present invention is equally applicable to rework PGA chip carriers having plated I/O pins in which the plated gold layer is unacceptably thick or thin. Both unplated I/O pins and plated I/O pins with an unacceptably thick or thin gold layer would be considered to be defectively plated I/O pins.

The following example will further illustrate the purposes and advantages of the present invention.

EXAMPLE

128 PGA chip carriers having unplated I/O pins were reworked as follows.

The PGA chip carriers were placed in a rack suitable for immersion in Applicants' etchant. The etchant was composed of 3.2 g/l of silver nitrate, 15 g/l potassium carbonate and 32 g/l of potassium cyanide. The pH was adjusted to be nominally 12. The temperature of the bath was 25° C. A positive DC potential was applied to the parts to generate a constant current density of 8.5 mA/cm$^2$. The DC potential changes during etching. The parts were etched for 215 seconds while being agitated.

After etching, the parts were rinsed followed by drying and inspection.

The parts were then immersed in conventional nickel and gold plating baths, rinsed, dried and inspected.

It was observed that all of the I/O pins were now satisfactorily plated, including those that were originally unplated and contained corrosion product.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of reworking PGA chip carriers having at least one unplated I/O pin, the method comprising the steps of:
   a. obtaining a PGA chip carrier having at least one I/O pin that is plated with gold over nickel and at least one I/O pin that is unplated but contains a corrosion product where the I/O pin should be plated;
   b. electrolytically etching the I/O pins with an aqueous etching solution comprising:
      a metal-providing compound selected from the group consisting of a silver salt, copper salt, copper cyanide, silver cyanide, gold cyanide or mixtures thereof, at a concentration in the range from 1 to 6 g/l as metal;
      potassium or sodium carbonate at a concentration in the range from 10 to 100 g/l; and
      potassium or sodium cyanide at a concentration in the range from 29 to 35 g/l,
   wherein the etching solution temperature is in the range from 20 to about 30° C., the etching solution pH is in the range from 11.5 to 13, and the current density is in the range from 7.5 to 9.5 mA/cm$^2$, and wherein the plated I/O pin is stripped of gold and the unplated pin is stripped of corrosion product.

2. The method of claim 1 wherein the etching solution is agitated during etching.

3. The method of claim 1 wherein the metal-providing compound is a silver salt.

4. The method of claim 3 wherein the silver salt is silver nitrate.

5. The method of claim 4 wherein the aqueous etching solution comprises 3.2 g/l silver nitrate, 15 g/l potassium carbonate and 32 g/l potassium cyanide.

* * * * *